United States Patent
Tai et al.

(10) Patent No.: US 7,236,022 B2
(45) Date of Patent: Jun. 26, 2007

(54) DEVICE AND METHOD FOR SETTING AN INITIAL VALUE

(75) Inventors: Kuo-Lin Tai, Chu Pei (TW); Johnson Yang, Chu Pei (TW); Sheng-Kai Chen, She Tou Hsiang (TW)

(73) Assignee: Realtek Semiconductor Corp., Hsin Chu (TW)

( * ) Notice: Subject to any disclaimer, the term of this patent is extended or adjusted under 35 U.S.C. 154(b) by 224 days.

(21) Appl. No.: 11/000,983

(22) Filed: Dec. 2, 2004

(65) Prior Publication Data

US 2005/0162205 A1    Jul. 28, 2005

(30) Foreign Application Priority Data

Dec. 3, 2003   (TW) ............................... 92134044 A
Feb. 12, 2004  (TW) ............................... 93103368 A

(51) Int. Cl.
  *H03L 7/00* (2006.01)
(52) U.S. Cl. ........................................ 327/142; 327/198
(58) Field of Classification Search ............... 327/142, 327/198; 326/38–40
  See application file for complete search history.

(56) References Cited

U.S. PATENT DOCUMENTS

| | | | |
|---|---|---|---|
| 5,155,730 A * | 10/1992 | Maida ........................... | 714/23 |
| 6,229,343 B1 * | 5/2001 | Bauer et al. ................. | 326/104 |
| 6,411,123 B1 * | 6/2002 | Chang .......................... | 326/38 |
| 6,509,767 B2 * | 1/2003 | Tanaka et al. ............... | 327/142 |
| 6,529,039 B2 * | 3/2003 | Sasaki ......................... | 326/38 |
| 6,784,691 B2 * | 8/2004 | Obergrussberger ........... | 326/37 |
| 6,894,501 B1 * | 5/2005 | Flasck et al. ................ | 324/416 |

FOREIGN PATENT DOCUMENTS

| JP | 58-115547 | * | 7/1983 |
|---|---|---|---|
| JP | 59-161761 | * | 9/1984 |

* cited by examiner

*Primary Examiner*—Kenneth B. Wells
(74) *Attorney, Agent, or Firm*—Birch, Stewart, Kolasch & Birch, LLP

(57) ABSTRACT

A device and a method for setting an initial value of a control chip. The device includes a setting unit, which is disposed outside the control chip and provides a setting signal, and a decoder, which is disposed inside the control chip, receives the setting signal, and generates a selecting signal according to the setting signal. The control chip obtains the initial value according to the selecting signal.

18 Claims, 5 Drawing Sheets

DEVICE AND METHOD FOR SETTING AN INITIAL VALUE

This application claims the benefit of the filing date of Taiwan Applications Ser. No. 092134044, filed on Dec. 3, 2003 and Ser. No. 093103368, filed on Feb. 12, 2004, the content of which is incorporated herein by reference.

BACKGROUND OF THE INVENTION

1. Field of the Invention

The invention relates to a controller, and more particularly to a device and a method for setting an initial value in a controller.

2. Description of the Related Art

Timing problems between clocks in a clock chip is an important issue. FIG. 1 shows a device for setting the phase of a clock signal in a conventional clock chip 100 in a personal computer. When the personal computer is booted (and/or the clock chip is reset), the register selector 110 in the clock chip 100 sends a fixed control data to the register 112 in order to set a default initial value because a control signal is fixed. Therefore, the clock chip 100 generates a plurality of clock signals, which have predetermined phase relationship, according to the default initial value. However, if the layout lengths of the clock signals in the printed circuit board (PCB) are not equal, the phase delays of the clock signals in the PCB are different such that the personal computer cannot be booted normally.

In general speaking, there are two conventional solutions to overcome the above-mentioned drawback. The first solution is to re-design a new PCB to change the layout length of the clock signals in the new PCB. The second solution is to change a new type clock chip to match the layout length of the clock signals in the original PCB. However, the two conventional solutions need to change the PCB or the clock chip. Hence, the two conventional solutions greatly increase the manufacturing costs, waste the production schedule, and thus impede the industry progress.

SUMMARY OF THE INVENTION

It is therefore an object of the invention to provide a device and a method for setting an initial value flexibly. The device flexibly adjusts the initial value of a chip using a setting unit disposed outside the chip.

An object of the invention is to provide a clock chip for flexibly setting the phase relationship of clock signals of the clock chip using a setting unit disposed outside the clock chip.

To achieve the above-identified object, the device for setting an initial value of a chip includes a setting unit and a decoder. The setting unit is disposed outside the chip and is used to provide a setting signal. The decoder is disposed inside the chip and is used to receive the setting signal and generate a selecting signal according to the setting signal. The chip obtains the initial value according to the selecting signal.

Thus, the invention can utilize the setting unit to generate a suitable setting signal and utilize the decoder to generate a suitable selecting signal. The invention overcomes the drawback of the incapability of flexibly adjusting the initial value in the prior art.

DETAILED DESCRIPTION OF THE INVENTION

Figure 2:
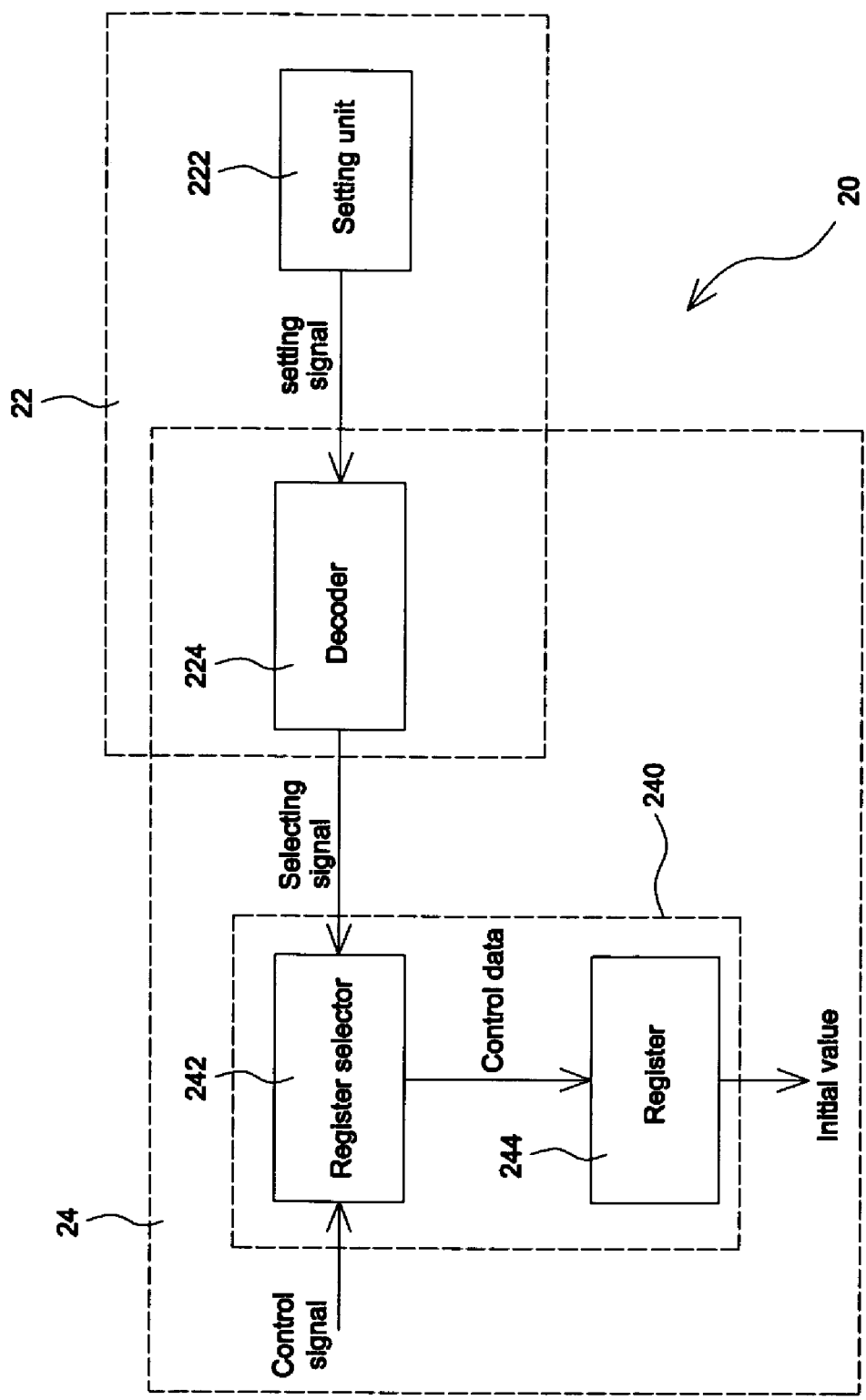
FIG. 2 shows a block diagram of an initial value setting device of a first embodiment of the invention.

FIG. 2 shows a block diagram of an initial value setting device of a first embodiment of the invention. As shown in FIG. 2, the initial value setting device 22 of this embodiment is used in a control chip 24. The initial value setting device 22 can provide a selecting signal to a register selector 242 in the control chip 24 when the control chip 24 is powered on. The register selector 242 outputs control data to a register 244 according to the selecting signal such that the control chip 24 can read the initial value from the register 244. Therefore, when an engineer wants to change the initial value of the control chip 24, the engineer can modify the setting unit 222 of the initial value setting device 22 to set a new initial value without re-designing a new PCB.

The initial value setting device 22 includes a setting unit 222 and a decoder 224. The setting unit 222 is disposed outside the control chip 24 and is used to provide the setting signal. So, the control chip 24 utilizes an input pin to get the setting signal. The setting unit 222 may be implemented by resistors to provide an analog setting signal. The setting unit 222 may be implemented by switches (jumps) to provide a set of digital setting signals. Therefore, the voltage of the setting signal can be adjusted by changing the resistance values of the resistors or the status (ON or OFF) of the switches. The decoder 224 receives the setting signal through the input pin, and then converts the setting signal into a selecting signal. In an embodiment, the decoder 224 includes an analog to digital converter (ADC) (not shown) or/and a look-up table (not shown). In the embodiment, the decoder 224 utilizes the ADC to convert the analog setting signal into a digital selecting signal. In another embodiment, the decoder 224 is a look-up table. The look-up table 224 receives a set of digital setting signals from the setting unit 222 and produces a selecting signal according to the set of digital setting signals. In an embodiment, the decoder 224 utilizes the ADC to convert the analog setting signal into a digital setting signal and the look-up table 224 receives the digital setting signal from the ADC and produces a selecting signal according to the digital setting signal.

Figure 1:
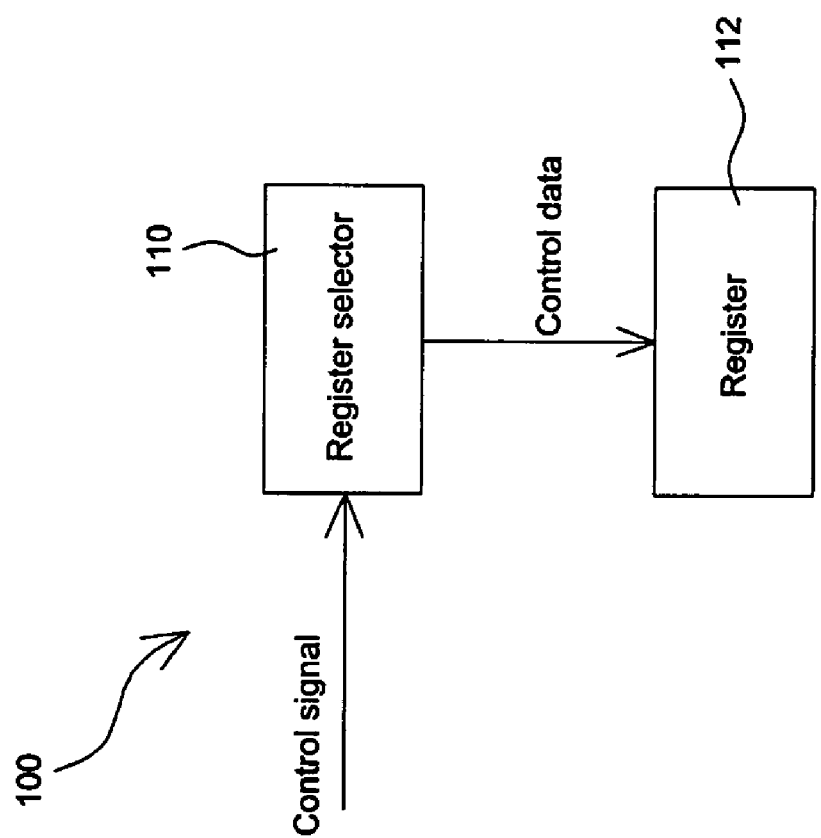
FIG. 1 shows a block diagram for setting the timings in a conventional clock chip.

Preferably, when the setting unit 222 is omitted, the initial value of control chip 24 of the invention and that of the conventional clock chip 100 in FIG. 1 are the same.

In an embodiment, the control chip 24 further includes the register selector 242 and the register 244. When the system 20 is turned on, the register selector 242 receives the selecting signal generated from the decoder 224, and outputs the control data to the register 244 according to the selecting signal and then the control chip 24 can read the control data from the register 244 as the initial value. After the system 20 is in a normal operation, the register selector 242 also can select and output other control data to the register 244 according to the control signal from the system 20, such that the engineer can control the function of the control chip 24 according to the control signal. Because the system 20 utilizes the register selector 242 to select and output the control data to the register 244 according to the selecting signal at the beginning of the normal operation of the system 20, the initial control data of the system 20 can be set using the initial value setting device 22 of the invention.

In this embodiment, the setting unit 222 is used to provide a setting signal, such as a voltage signal or a current signal or a set of digital signals, so that the decoder 224 can generate the selecting signal according to the setting signal. If the setting unit 222 utilizes resistors to provide the setting signal, the voltage of the selecting signal can be adjusted by changing different resistance values, and therefore the register selector 242 can output different control data to the register 244. Of course, the setting unit 222 may be implemented using other structures as long as different setting signals may be generated using different components. The register selector 242 and the register 244 may be regarded as an initial value output unit 240. The register selector 242 and the register 244 are an embodiment of the initial value output unit 240.

When the power is turned on, the setting unit 222 generates the setting signal. The decoder 224 processes the setting signal by way of, for example, voltage comparison, analog-to-digital conversion, or the like, and generates the selecting signal outputted to the register selector 242. The register selector 242 selects and outputs the control data to the register 244 according to the selecting signal such that the control chip 24 reads the data from the register 244 as the initial value. In an embodiment, the control chip 24 is a clock chip. When the clock chip 24 is reset, the clock chip 24 can directly output the required phase relationship between the clock signals according to the setting signal of the setting unit 222. The engineer can directly adjust the phases of the clock signals of the clock chip 24 according to the control signal.

For example, when the voltage of the setting signal is V1 and the computer system cannot be booted due to the errors of phase relationship, the voltage of the setting signal may be adjusted to V2 by changing the resistance of the setting unit 222. Thus, the phase relationship of the clock signals outputted from the clock chip 24 may be adjusted, and the computer system may be successfully booted.

Figure 3:
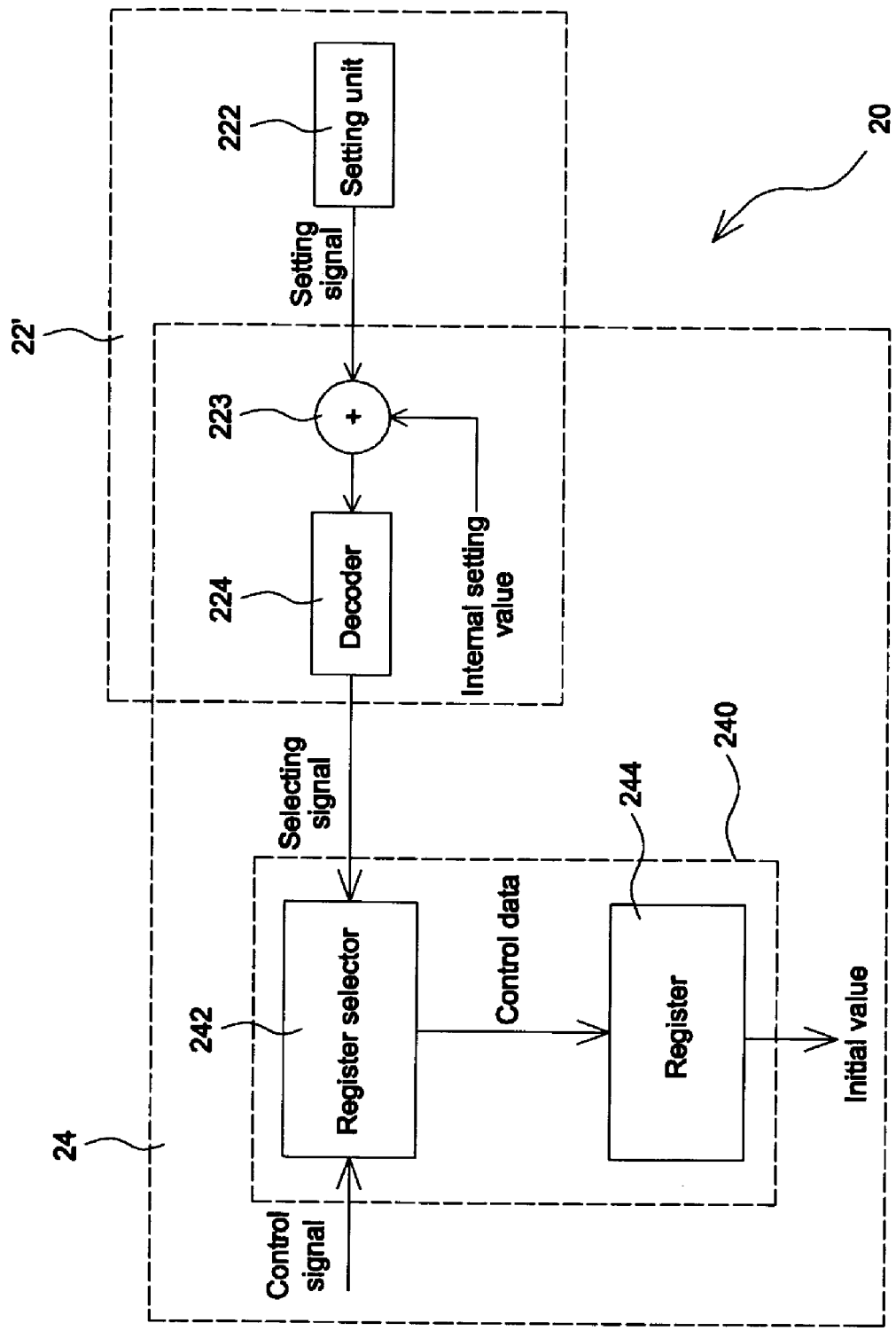
FIG. 3 shows a block diagram of an initial value setting device of a second embodiment of the invention.

FIG. 3 shows a block diagram of an initial value setting device 22' of a second embodiment of the invention. The initial value setting device 22' further includes an adder 223 for adding an internal setting value to the setting signal from the setting unit 222 and outputting the added setting signal to the decoder 224. Consequently, when the control chip 24 is in normal operation, different control data may be selected and outputted according to the internal setting value.

Figure 4:
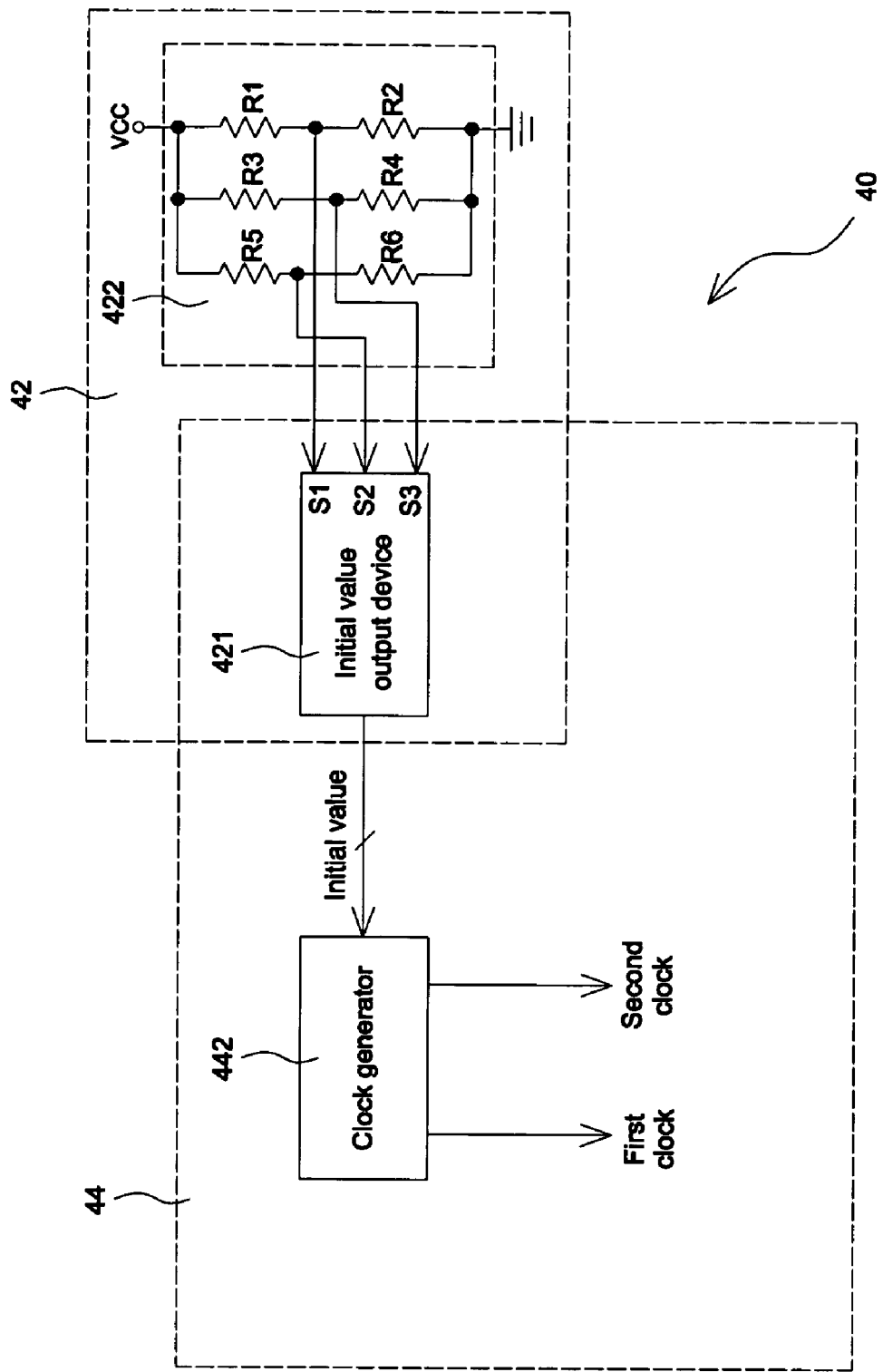
FIG. 4 shows a block diagram of an initial value setting device of a third embodiment of the invention.

FIG. 4 shows a block diagram of an initial value setting device 42 according to a third embodiment of the invention. The system 40 includes a control chip 44 and the setting unit 422 of the invention. In the embodiment, the initial value setting device 42 includes a setting unit 422 disposed outside the control chip 44 and an initial value output device 421 disposed in the control chip 44. The setting unit 422 provides a set of setting signals to the initial value output device 421 in the control chip 44 such that the initial value output device 421 can generate an initial value to the clock generator 442 according to the setting signals from the setting unit 422. Therefore, when the phase relationship between clocks in the control chip 44 have to be adjusted, the setting unit 422 can be controlled to output the setting signals.

In an embodiment, as shown in FIG. 4, the setting unit 422 provides a plurality of setting signals, for example S1, S2 and S3, to an initial value output device 421. For example, the setting signal S1 can be defined as a symbol signal to indicate leading phase or lagging phase, the setting signal S2 can be defined as a coarse setting value and setting signal S3 can be defined as a fine setting value. In an embodiment, the setting unit 422 is implemented by resistors R1 to R6. Of course, the setting unit 422 also can be implemented by switches for changing the level of the setting signals. The initial value output device 421 receives the setting signals S1, S2 and S3 and generates an initial value to a clock generator 442.

Figure 5:
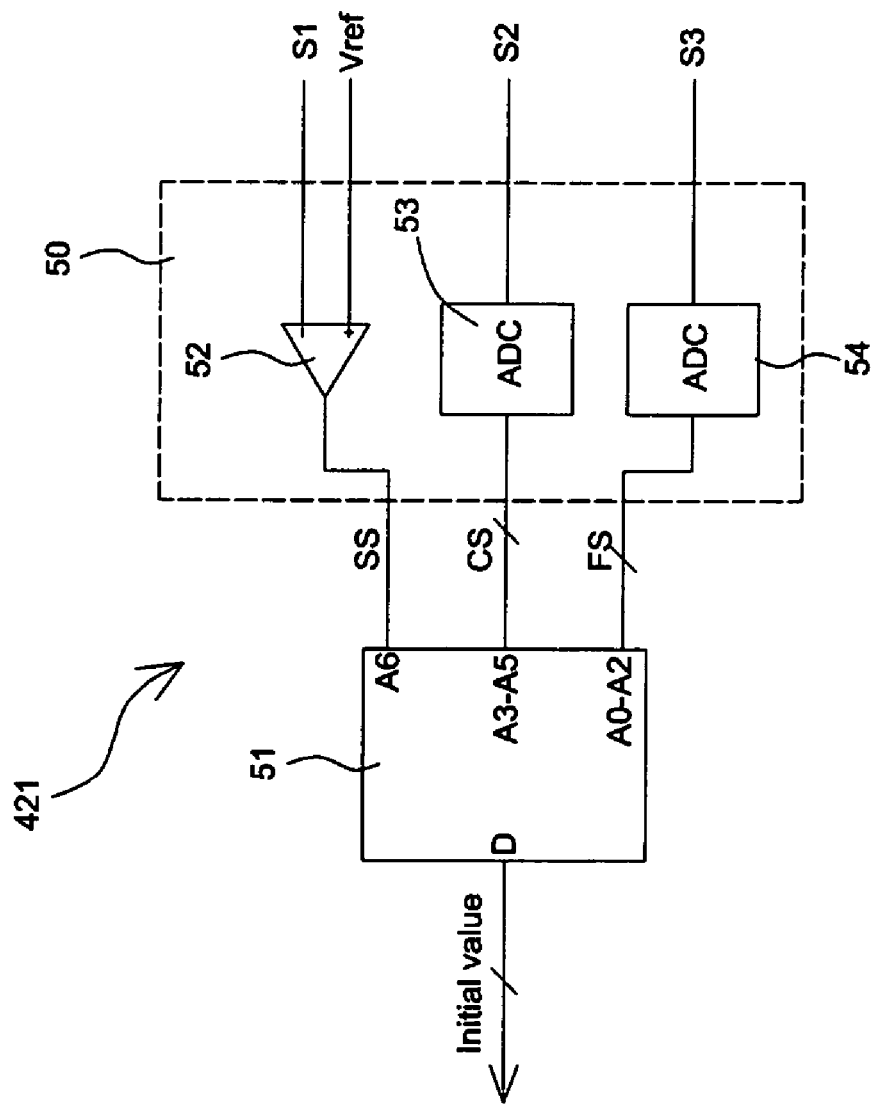
FIG. 5 shows a block diagram of an initial value output device in FIG. 4.

FIG. 5 is a block diagram of an embodiment of the initial value output device 421 in the FIG. 4. As shown in FIG. 5, the initial value output device 421 comprises a decoder 50 and an initial value output unit 51. In an embodiment, the decoder 50 comprises a comparator 52 and two ADC (Analog to Digital Converter) 53 and 54. In an embodiment, the initial value output unit 51 is a memory. The comparator 52 receives the setting signal S1 and a reference voltage Vref and outputs a first selecting signal SS. The first ADC 53 receives the setting signal S2 and converts it into a second selecting signal CS. The second ADC 54 receives the setting signal S3 and converts it into a third selecting signal FS. In an embodiment, the first, second, and third selecting signals are a digital symbol signal, a coarse signal, and fine signal, respectively. In an embodiment, the initial value output unit 51 is a memory. The initial value output unit 51 receives the selecting signals SS, CS and FS as address signals and output the corresponding data as the initial value. Because the initial value outputting device 421 uses the memory to store phase data and uses the coarse signal and the fine signal to select a corresponding initial value, it can provide the corresponding initial value to control the first and second clock signals with correct and precise phase relationship (phase delay). Although the resolution of the ADC is three bits, it can be designed to two bits or more bits at different situation. In the embodiment, although the symbol signal SS is regarded as a MSB of the address signal, it also can be regarded as the MSB of the setting signal to reduce the memory space of the memory.

As shown in FIG. 4, when the system is power-on, the clock generator 442 generates at least two clocks according to the initial value from the initial value output device 421. In an embodiment, the clock generator 442 includes an adder for adding the initial phase delay signal and the corresponding initial value to get a final phase delay and generates the first and second clock signals according to the final phase delay. Of course, the initial phase delay signal can be omitted and the initial value is used as the final phase delay. For example, assume that the unit of phase delay time in the clock generator 442 is 1 ns. If the final phase delay is 6, the phase delay time between the first clock and the second clock is controlled at 6 ns. For example, the units of the phase delay time of the coarse address signal CS and fine address signal FS are defined as 10 ns and 1 ns, respectively, and the values of the coarse address signal CS and fine address signal FS are defined as Vcs and Vfs. The data Dss stored in the initial value output unit (memory) 51 can be calculated by:

$$Dss = Vcs*10 + Vfs$$

For example, 0 is stored in the address [0000000H], 1 is stored in the address [0000001H], 10 is stored in the address [0001000H], 20 is stored in the address [0010000H], ..., and 77 is stored in the address [0111111H].

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. An apparatus for setting an initial value in a chip, comprising:
   a setting unit disposed outside the chip and for providing a setting signal;
   an adder for adding an internal setting value to the setting signal and outputting an added setting signal to the decoder; and
   a decoder, coupled to the adder, for receiving the added setting signal and setting the initial value of the chip according to the added setting signal.

2. The apparatus of claim 1, further comprising:
   a storage unit, coupled to the decoder, for storing a plurality of initial values and selectively outputting one of initial values according to the added setting signal.

3. The apparatus of claim 2, wherein the setting unit comprises a resistor-type voltage divider circuit.

4. The apparatus of claim 2, wherein the setting unit comprises a plurality of switches.

5. The apparatus of claim 2, wherein the chip comprises a clock generator generating a first clock signal and a second clock signal, and wherein the phase relationship between the first clock signal and the second clock corresponds to the initial value.

6. The apparatus of claim 1, wherein the decoder comprises:
   an analog-to-digital converter for converting the setting signal into a digital selecting signal, wherein the initial value of the chip is determined according to the digital selecting signal.

7. The apparatus of claim 1, wherein the decoder comprises:
   a look-up table for receiving the setting signal and outputting a selecting signal according to the setting signal, wherein the initial value of the chip is determined according to the selecting signal.

8. The apparatus of claim 1, wherein the decoder comprises:
   an analog-to-digital (ADC) converter for converting the setting signal into a digital selecting signal; and
   a look-up table, coupled to ADC, for outputting a selecting signal according to the digital setting signal, wherein the initial value of the chip is determined according to the selecting signal.

9. A method for setting an initial value of a chip, comprising:
   receiving a setting signal from a setting unit disposed outside the chip;
   generating a selecting signal according to the setting signal; and
   selectively outputting one of a plurality of initial values according to the selecting signal;
   wherein the setting signal comprises a coarse setting signal and a fine setting signal.

10. The method of claim 9, wherein the selecting signal is generated according to the setting signal and an internal setting value of the chip.

11. The method of claim 9, wherein the step of generating the selecting signal comprises:
    receiving the setting signal and converting the setting signal into a digital setting signal; and
    generating the selecting signal according to the digital setting signal.

12. The method of claim 9, wherein the selecting signal is an address signal of a memory.

13. An apparatus for setting an initial value, comprising:
    a setting unit for providing at least one setting signal;
    a decoder, coupled to the setting unit, for generating a selecting signal according to the setting signals; and
    an initial value output unit, coupled to the decoder, for selectively outputting one of a plurality of initial values according to the selecting signal;
    wherein the at least one setting signal comprises a coarse setting signal and a fine setting signal.

14. The apparatus of claim 13, wherein the decoder comprises:
    at least one comparator for receiving the setting signal and a reference voltage and generating the selecting signal.

15. The apparatus of claim 13, wherein the decoder comprises:
    at least one analog-to-digital converter for receiving the setting signal and generating the selecting signal.

16. The apparatus of claim 13, wherein the initial value output unit comprises a memory, and the selecting signal is an address signal of the memory.

17. The apparatus of claim 13, wherein the setting unit comprises a plurality of switches.

18. The apparatus of claim 13, wherein the setting unit comprises a resistor-type voltage divider circuit.

* * * * *